US006842131B1

(12) United States Patent
Lo et al.

(10) Patent No.: US 6,842,131 B1
(45) Date of Patent: Jan. 11, 2005

(54) DELTA-SIGMA MODULATOR

(75) Inventors: Li-Sheng Lo, Jhubei (TW); Tung-Tsai Liao, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/847,399

(22) Filed: May 18, 2004

(30) Foreign Application Priority Data

May 21, 2003 (TW) ........................................ 092113755

(51) Int. Cl.[7] ................................................ H03M 3/00
(52) U.S. Cl. ........................................ 341/143; 341/144
(58) Field of Search ................................ 341/143, 144, 341/155

(56) References Cited

U.S. PATENT DOCUMENTS 6,700,520 B1 * 3/2004 Miller ........................ 341/143
6,795,004 B2 * 9/2004 Masuda et al. ............. 341/143

* cited by examiner

*Primary Examiner*—Brian Young
(74) *Attorney, Agent, or Firm*—Bacon & Thomas PLLC

(57) ABSTRACT

A Delta-Sigma modulator is disclosed, which has a Delta adder, a Sigma adder, a first latch, a second latch and a feedback generator, wherein the feedback generator provides a feedback signal to the Delta adder based on a pre-stage data signal provided by the first latch, so that the Delta adder provides a pre-stage addition signal. The Sigma adder performs an accumulation to provide an accumulative signal to the first latch, so that the first latch provides a pre-stage data signal to the second latch to enable the second latch to output a digital output signal.

7 Claims, 5 Drawing Sheets

DELTA-SIGMA MODULATOR

BACKGROUND OF THE INVENTION

1. Field of the Invention

The present invention relates to the technical field of signal modulation and, more particularly, to a Delta-Sigma modulator.

2. Description of Related Art

Typically, Delta-Sigma modulation is used for converting the analog signal to the digital signal via comparing a reference voltage formed by accumulating a fixed voltage with an input voltage. When the analog signal is in the states that the difference of the analog signal is instantaneously too large, the transmitting speed of the analog signal is too fast, or the slope of the analog signal is too large, the reference voltage cannot easily trace the input analog signal, which results in that the digital signal processed by the Delta-Sigma modulation is distorted and the input analog signal cannot be responded in real time.

FIG. 1 shows the diagram according to the prior Delta-Sigma modulation, which includes an integrator 11 and a quantizer 12. The prior Delta-Sigma modulation further utilizes a feedback means to generates digital output signal. FIG. 2 shows a comparison for the analog input signal and the digital output signal of the prior Delta-Sigma modulation. When the change of the analog input signal is fast, the density of the digital output signal is tight. Conversely, when the change of the analog input signal is slow, the density of the digital output signal is sparse. The prior Delta-Sigma modulation uses the sampling means to convert the signal, so that there is a functional relation between the input signal, the output signal and the sampling rate. Therefore, when the frequency of the input signal is too fast and the sampling rate is fixed, the output signal will be distorted.

The aforementioned Delta-Sigma modulation techniques are used as an analog/digital converter (ADC) for converting the analog signal to the digital signal. The digital signal can be restored to the analog signal via a low pass filter. In addition, the prior Delta-Sigma modulation cannot directly scale up or scale down the input signal in the modulation. One solution for scaling up/down the input signal is to use an additional multiplier to scale up/down the input signal at certain processing point such as before the input signal modulation or after the output signal is processed. Another solution is to use at least one adder to scale up the output signal. However, the additional multiplier and adder both occupy much space, which makes chip miniaturization difficult. Further solution is to utilize a RC circuit to control the signal level after low pass filtering, but the RC circuit is complex and thus the cost is increased.

Therefore, a need exists for providing a Delta-Sigma modulator so as to be capable of controlling signal level without RC circuits or additional multipliers and eliminating the distortion that is caused by the sampling rate.

SUMMARY OF THE INVENTION

The object of the present invention is to provide a Delta-Sigma modulator so as to be capable of controlling signal level without external circuits or additional multipliers.

To achieve the object, the Delta-Sigma modulator of the present invention includes: a Delta adder, receiving a digital input signal and a feedback signal for performing an addition operation to provide a pre-stage addition signal; a Sigma adder, coupled to the Delta adder for receiving the pre-stage addition signal and a pre-stage data signal, thereby performing a accumulation to provide a accumulative signal; a first latch, coupled to the Sigma adder and receiving a clock signal and the accumulative signal respectively, thereby latching the accumulative signal or outputting the pre-stage data signal based on the clock signal; a feedback generator, coupled to the first latch for receiving the pre-stage data signal and providing the feedback signal based on an adjustment signal; and a second latch, coupled to the first latch and receiving the clock signal and the pre-stage data signal, thereby latching the pre-stage data signal or outputting a digital output signal based on the clock signal.

Other objects, advantages, and novel features of the invention will become more apparent from the following detailed description when taken in conjunction with the accompanying drawings.

BRIEF DESCRIPTION OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF THE PREFERRED EMBODIMENT

Figure 1:
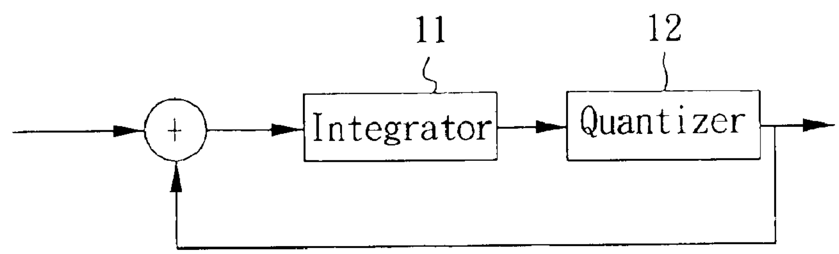
FIG. 1 is a block diagram according to the prior Delta-Sigma modulation.
Figure 2:
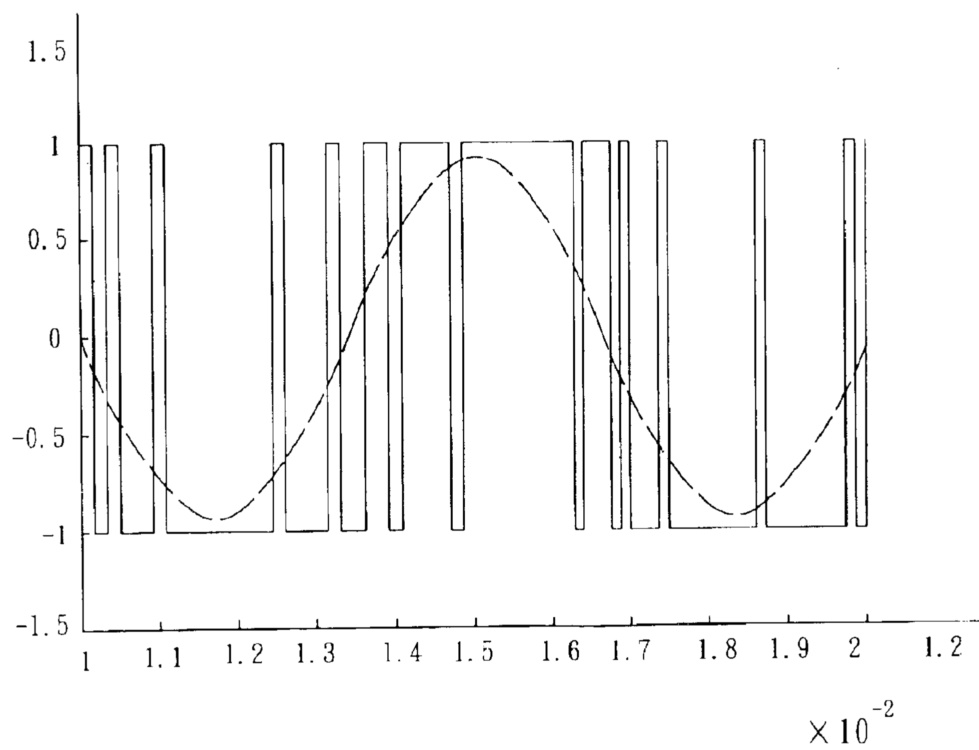
FIG. 2 is a diagram according to the comparison of the analog input signal and the digital output signal of the prior Delta-Sigma modulation.
Figure 3:
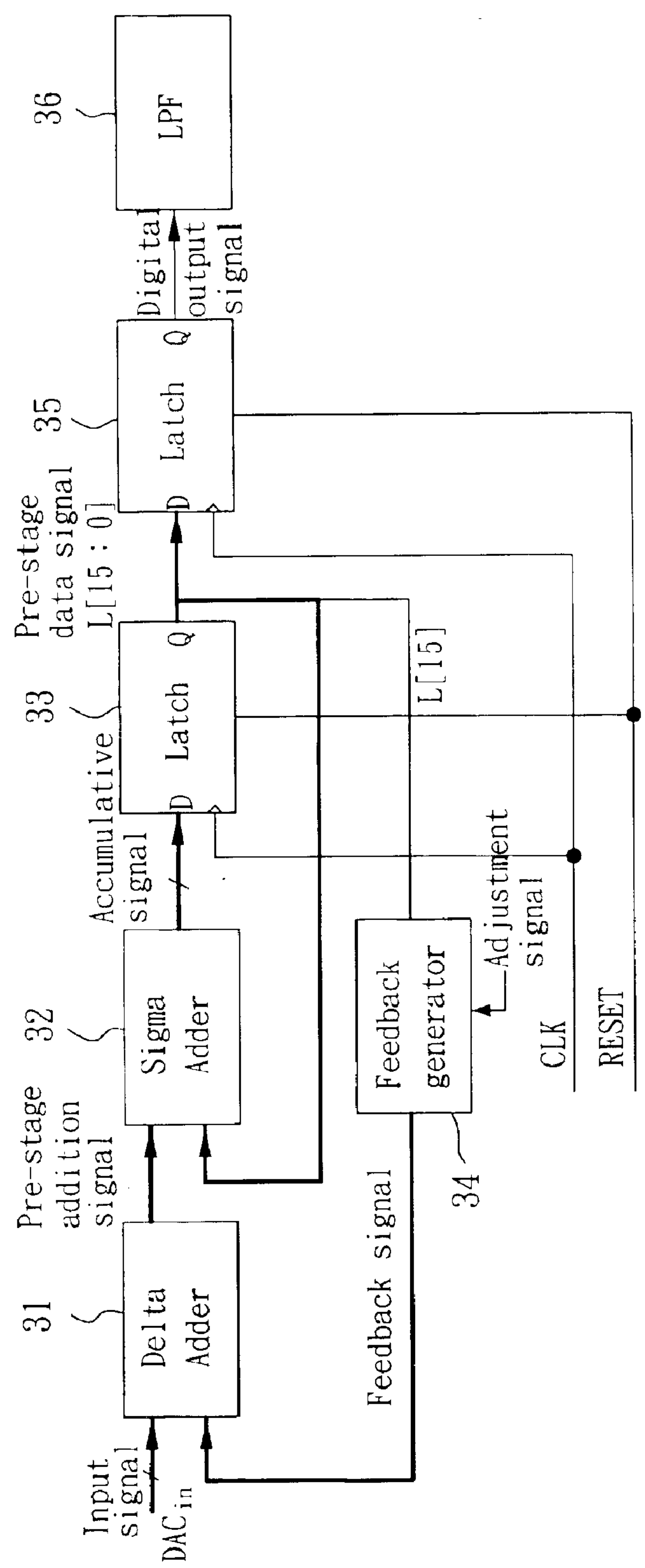
FIG. 3 is a block diagram according to the preferred embodiment of the present invention.

With reference to FIG. 3, there is shown a Delta-Sigma modulator in accordance with a preferred embodiment of the present invention, which is provided for volume control for illustrative purpose. As shown, the Delta-Sigma modulator includes a Delta adder 31, a Sigma adder 32, a first latch 33, a feedback generator 34, a second latch 35 and a low pass filter (LPF) 36. In this embodiment, the first latch 33 and the second latch are preferred to be D-type flip-flops. The output of the Delta adder 31 is connected to the input of the Sigma adder 32 and the output of the Sigma adder 32 is connected to the input (D-pin) of the first latch 33. The output (Q-pin) of the first latch 33 is connected to the input of the Sigma adder 32, the input of the feedback generator 34 and the input of the second latch 35, respectively. The first latch 33 and the second latch 35 are also connected to a clock signal line (CLK) for receiving a clock signal and a reset signal line for receiving a reset signal, respectively. The output of the feedback generator 34 is connected to the input of the Delta adder 31. The output of the second latch 35 is connected to the low pass filter 36.

The Delta adder 31 is used for receiving a digital input signal having Y bits and a feedback signal to perform an addition, wherein the input signal having Y bits is processed by signed bit extension to become a digital input signal (DACin) having N bits before being inputted to the Delta adder 31. Besides, the digital input signal having Y bits to be inputted to the Delta adder 31 is converted from an analog signal via an analog/digital converter (ADC). In the preferred embodiment, the Delta adder 31 and the Sigma adder 32 are N-bits adders. Therefore, the range of the digital input signal expressed as signed representation is $-2^{Y-1} \sim 2^{Y-1}-1$ (i.e., −512~511 for Y=10 and N=16).

The feedback generator 34 is used for receiving a pre-stage data signal, such as L[15:0] provided by the first latch 33 to generate a feedback signal, wherein the value of the feedback signal is $-2^{Z-1}$ or $2^{Z-1}1$ if the feedback signal has Z bits. In the volume is not changed, the feedback generator 34 adjusts the level of the feedback signal based on an adjustment signal. For example, if the range of the digital input signal DACin is between −512~511, the value of the feedback signal will be adjusted to −512 or 511. Namely, when the pre-stage data signal L[15], which is provided by the first latch 33, is at a low level (i.e., 0), the feedback generator 34 generates a feedback signal with a value of 511 to the Delta adder 31, so that the Delta adder 31 performs an operation of DACin +511. When the pre-stage data signal L[15] is at a high level (i.e., 1), the feedback generator 34 generates a feedback signal with a value of −512 to the Delta adder 31, so that the Delta adder 31 performs an operation of DACin −511.

The Delta adder 31 is used for receiving the digital input signal and the feedback signal, thereby providing a pre-stage addition signal. Because the feedback signal level (i.e., 511 or −512) is the same with the digital input signal (DACin) level, the ratio of the feedback signal and the digital input signal is 1. Therefore, the Delta adder 31 doesn't change the level of the pre-stage addition signal. Namely, the Delta adder 31 doesn't scale up-or down the digital input signal level. Then, the Sigma adder 32 receives the pre-stage addition signal provide by the Delta adder 31 and the pre-stage data signal provided by the first latch 33 so as to perform an accumulation for the pre-stage addition signal to provide a accumulative signal and then transmit the accumulative signal to the first latch 33. The first latch 33 receives the accumulative signal and the clock signal, so as to latch the accumulative signal or output the accumulative signal as the pre-stage data signal based on the clock signal.

If the volume is still unchanged, the feedback generator 34 continues with generating the feedback signal to the Delta adder 31. The second latch 35 receives the pre-stage data signal provided by the first latch 33 and the clock signal, so as to latch the pre-stage data signal or output the pre-stage data signal as the digital output signal based on the clock signal. Furthermore, the digital output signal can be restored to the analog signal via the low pass filter 36.

Figure 4:
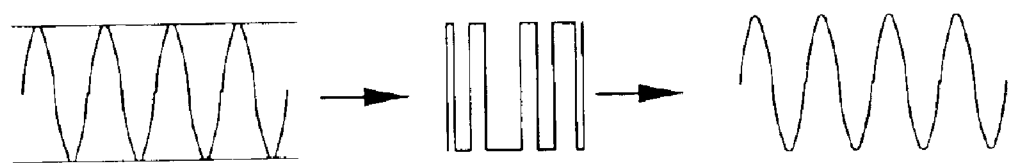
FIG. 4 shows the waveforms for maintaining the output signal the same with the input signal in the present invention.

FIG. 4 shows the waveform of the digital input signal before the Delta-Sigma modulation, the waveform of the signal after being modulated but not scaled up, and the waveform of signal after being restored into analog signal by the LPF 36, respectively.

When the volume is to be adjusted to quarter of the original one, the value of the feedback signal is adjusted to −2048 or 2047 by the adjustment signal. Therefore, when the pre-stage data signal L[15] is at low level (i.e., 0), the feedback generator 34 generates the feedback signal with a value of 2047 to the Delta adder 31, so that the Delta adder 31 performs an operation of DACin +2047. Similarly, when the pre-stage data signal L[15] is at high level (i.e., 1), the feedback generator 34 generates the feedback signal with a value of −2048 to the Delta adder 31, so that the Delta adder 31 performs an operation of DACin −2048.

However, the density of the digital output signal of the modulator is related to the ratio of the feedback signal and the digital input signal. For example, scaling up the feedback signal by four times is equivalent to scaling down the digital input signal by a quarter at the original time of the feedback signal, so that the output volume of the modulator will be scaled down by a quarter.

Figure 5:
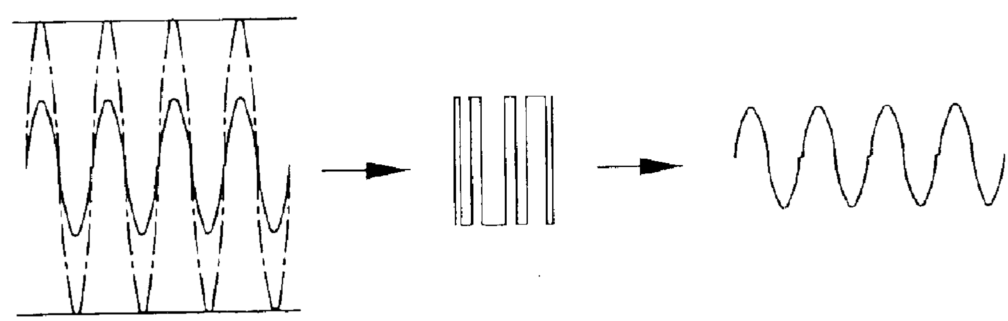
FIG. 5 shows the waveforms for scaling down the output signal in the present invention.

FIG. 5 shows the waveform of the digital input signal before the Delta-Sigma modulation, the waveform of the signal after being scaled up by four times, the waveform of the signal after being modulated and scaled down by a quarter, and the waveform of signal after being restored to analog signal by the LPF 36, respectively. Alternatively, the value of the feedback signal level can be adjusted to −32768 or 32767 based on the adjustment signal so as to scale down the volume by one sixty-fourths.

Figure 6:
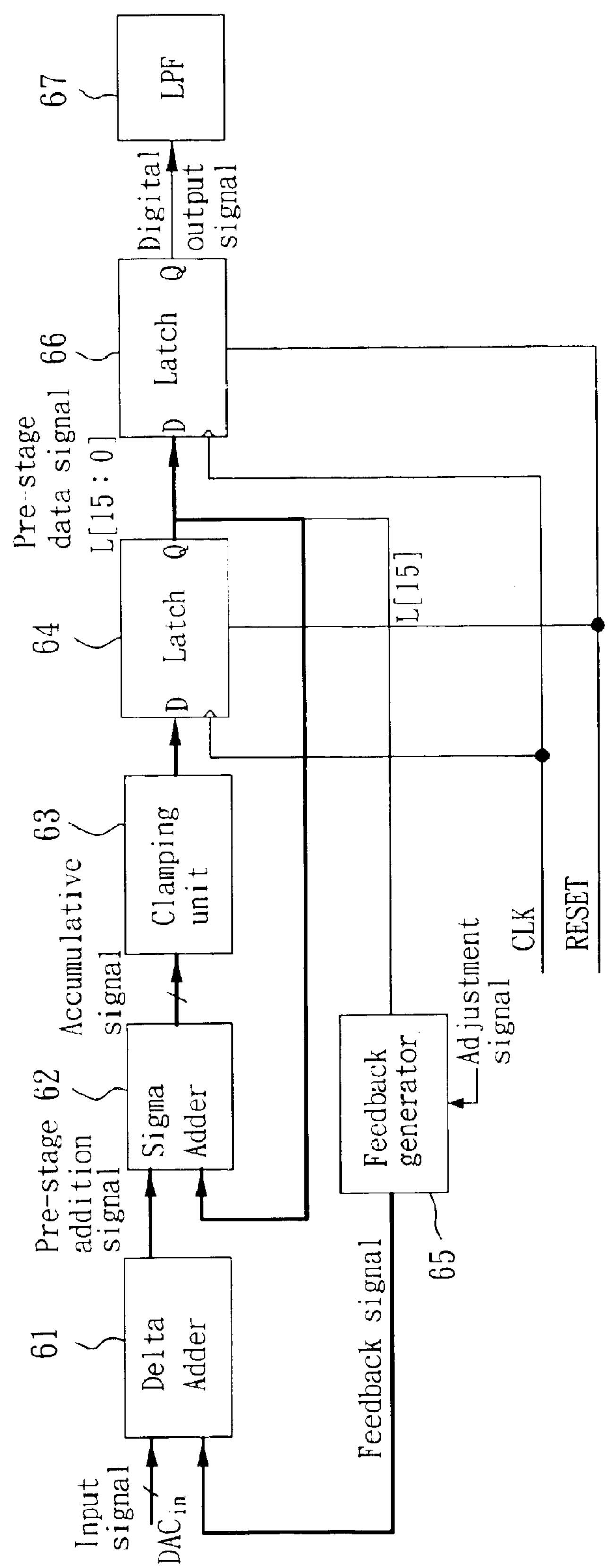
FIG. 6 is a block diagram for scaling up signal according to the present invention.

FIG. 6 shows the block diagram for increasing the volume, which includes a Delta adder 61, a Sigma adder 62, a first latch 64, a feedback generator 65, a second latch 65, a low pass filter 67, and a clamping unit 63 connected between the Sigma adder 62 and the first latch 64. The clamping unit 63 is used for clamping at the saturation condition. Namely, when scaling up the digital input signal occurs saturation, such as the modulated signal becomes larger than the signal level of the modulator, the clamping unit 63 cuts off a part of the signal out of the signal level of the modulator, for example, the signal that is out of the 9 bits level.

When the volume is to be adjusted to double of the original one, if the double of the digital input signal is not out of the representation of the 10 bits (i.e., the most significant bit of the input digital signal is 0), then the feedback signal is adjusted to −256 or 255 by the adjustment signal. Therefore, when the pre-stage data signal L[15] is at low level (i.e., 0), the feedback generator 65 provides the feedback signal with a value of 255 to the Delta adder 61, so that the Delta adder 61 performs an operation of DACin +25. Similarly, when the pre-stage data signal L[15] is at high level (i.e., 1), the feedback generator 65 provides the feedback signal with a value of −256 to the Delta adder 61, so that the Delta adder 61 performs an operation of DACin −2048.

Similarly to the above description, the density of the digital output signal of the modulator is related to the ratio of the feedback signal and the digital input signal, and thus the level value of the feedback signal is reduced to half of the original level value of the feedback signal so that the digital output signal (the volume) is scaled up to double. However, a part of the accumulative signal provided by the Sigma adder 62 is out of the limitative level range of the modulator (i.e., 9 bits), the clamping unit 63 clamps the part of the accumulative signal out of the imitative level range, and then sends a clamping result which is processed by the clamping unit 63 to the first latch 64. Finally, the low pass filter 67 outputs the doubled volume.

Figure 7:
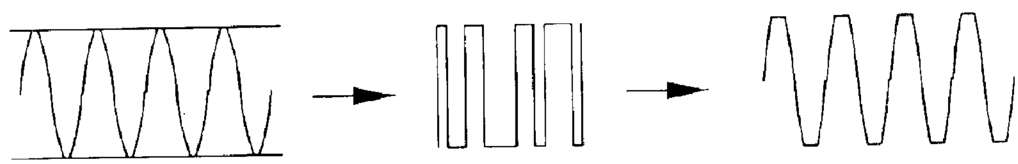
FIG. 7 shows the waveforms for scaling up the output signal in the present invention.

FIG. 7 shows the waveform of the digital input signal after being scaled down by half, the waveform of the signal after being modulated and scaled up by double, and the waveform of the signal after being restored to analog signal by the LPF 67, respectively.

In view of the foregoing, it is known that the present invention utilizes Delta-Sigma means to scale up or down signal by a magnification factor of $2^Y/2^Z$ on digital base (Y is the number of bits in the digital input signal and Z is the number of bits in the feedback signal), and controls the digital input signal to scale up/down the digital input signal based on the feedback signal provided by the feedback generator for scaling up/down the output signal of the modulator, thereby being capable of controlling the signal level without external circuits or additional multipliers.

Although the present invention has been explained in relation to its preferred embodiment, it is to be understood that many other possible modifications and variations can be made without departing from the spirit and scope of the invention as hereinafter claimed.

What is claimed is:

1. A Delta-Sigma modulator, comprising:

a Delta adder, receiving a digital input signal and a feedback signal for performing an addition operation to provide a pre-stage addition signal;

a Sigma adder, coupled to the Delta adder for receiving the pre-stage addition signal and a pre-stage data signal, thereby performing a accumulation to provide a accumulative signal;

a first latch, coupled to the Sigma adder and receiving a clock signal and the accumulative signal respectively, thereby latching the accumulative signal or outputting the pre-stage data signal based on the clock signal;

a feedback generator, coupled to the first latch for receiving the pre-stage data signal and providing the feedback signal based on an adjustment signal; and a second latch, coupled to the first latch and receiving the clock signal and the pre-stage data signal, thereby latching the pre-stage data signal or outputting a digital output signal based on the clock signal.

2. The Delta-Sigma modulator as claimed in claim 1, further comprising a low pass filter coupled to the second latch for converting the digital output signal to an analog signal.

3. The Delta-Sigma modulator as claimed in claim 1, further comprising a clamping unit connected between the Sigma adder and the first latch for clamping the accumulative signal, thereby scaling up the digital input signal.

4. The Delta-Sigma modulator as claimed in claim 1, wherein the digital input signal is scaled up or down signal by a magnification factor of $2^Y/2^Z$, where Y is the number of bits in the digital input signal and Z is the number of bits in the feedback signal.

5. The Delta-Sigma modulator as claimed in claim 1, wherein the digital input signal is expressed by signed representation, and the digital input signal has a value in the range of $-2^{Y-1}\sim 2^{Y-1}-1$ where Y is the number of bits in the digital input signal.

6. The Delta-Sigma modulator as claimed in claim 1, wherein the feedback signal has a value of $-2^{Z-1}$ or $2^{Z-1}-1$, where Z is the number of bits in the feedback signal; when the pre-stage data signal received by the feedback generator is at low level, the feedback generator outputs $2^{Z-1}-1$ to the Delta adder; when the pre-stage data signal received by the feedback generator is at high level, the feedback generator outputs $-2^{Z-1}$ to the Delta adder.

7. The Delta-Sigma modulator as claimed in claim 1, wherein the first latch and the second latch are D-type flip-flops.

* * * * *